United States Patent
Yin et al.

(10) Patent No.: US 9,496,880 B1
(45) Date of Patent: Nov. 15, 2016

(54) FULLY DIFFERENTIAL CHARGE PUMP WITH SWITCHED-CAPACITOR COMMON-MODE FEEDBACK

(71) Applicant: QUALCOMM Incorporated, San Diego, CA (US)

(72) Inventors: Wenjing Yin, San Diego, CA (US); Jeffrey Mark Hinrichs, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/826,888

(22) Filed: Aug. 14, 2015

(51) Int. Cl.
*H03L 7/06* (2006.01)
*H03L 7/089* (2006.01)
*H02M 3/07* (2006.01)

(52) U.S. Cl.
CPC .............. *H03L 7/0891* (2013.01); *H02M 3/07* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,075,406 A * | 6/2000 | Lee .................. | H03L 7/0896 307/110 |
| 7,042,261 B2 | 5/2006 | Lee et al. | |
| 7,075,348 B2 | 7/2006 | Hsu et al. | |
| 7,659,783 B2 | 2/2010 | Tai | |
| 7,692,458 B1 * | 4/2010 | Eker .................. | H03L 7/0896 327/148 |
| 8,368,443 B1 | 2/2013 | Su | |
| 8,773,184 B1 * | 7/2014 | Petrov .................. | H03L 7/093 327/148 |
| 2003/0034813 A1 * | 2/2003 | Sanduleanu .......... | H03F 3/3432 327/157 |
| 2006/0044030 A1 * | 3/2006 | Baez .................. | H03L 7/0893 327/156 |
| 2008/0238489 A1 * | 10/2008 | Sanduleanu .......... | H03L 7/087 327/42 |
| 2009/0189654 A1 * | 7/2009 | Clements .............. | H03L 7/0895 327/157 |
| 2009/0189701 A1 * | 7/2009 | Clements .............. | H03L 7/0891 331/17 |
| 2010/0039182 A1 * | 2/2010 | Galton .................. | H03K 23/54 331/1 A |
| 2010/0066420 A1 * | 3/2010 | Kaneko .................. | H03L 7/0896 327/157 |
| 2011/0199063 A1 * | 8/2011 | Chern .................. | H03L 5/00 323/284 |
| 2012/0146692 A1 * | 6/2012 | Yun .................. | H03L 7/087 327/157 |
| 2012/0200327 A1 * | 8/2012 | Sreekiran .............. | H03L 7/0893 327/157 |
| 2014/0091954 A1 * | 4/2014 | Zhu .................. | H02M 3/06 341/110 |

OTHER PUBLICATIONS

Bula C.D, et al., "Practical Considerations for the Design of Fully Differential OTAs with SC-CMFB", Electrical and Computer Engineering Department, Jan. 2010, 4 Pages.

(Continued)

*Primary Examiner* — Adam Houston
(74) *Attorney, Agent, or Firm* — Patterson & Sheridan, L.L.P.

(57) ABSTRACT

Certain aspects of the present disclosure provide methods and apparatus for implementing a fully differential charge pump circuit that eliminates a source of noise and power consumption by using a low-noise switched-capacitor common-mode feedback (CMFB) circuit, rather than a continuous-time amplifier-based CMFB circuit. The fully differential charge pump circuit presented in this disclosure includes the switched-capacitor CMFB (SC-CMFB) unit connected to differential output nodes of the charge pump and provides a feedback signal to the charge pump to control a common-mode voltage of the differential signals based on a reference common-mode voltage. In certain aspects, a replica phase-frequency detector (PFD), a frequency divider, and a non-overlapping clock generator provides control signals for the SC-CMFB circuit.

30 Claims, 7 Drawing Sheets

(56) References Cited

OTHER PUBLICATIONS

Cheng S., et al., "Design and Analysis of an Ultrahigh-Speed Glitch-Free Fully Differential Charge Pump With Minimum Output Current Variation and Accurate Matching," IEEE Transactions on Circuits and Systems—II: Express Briefs, Sep. 2006, vol. 53 (9), pp. 843-847.

Lee I.Y., et al., "Spur Reduction Techniques with a Switched-Capacitor Feedback Differential PLL and a DLL-Based SSCG in UHF RFID Transmitter," IEEE Transactions on Microwave Theory and Techniques, Apr. 2015, vol. 63 (4), pp. 1202-1210.

Lee T.S., "Low-Voltage Fully Differential CMOS Switched-Capacitor Amplifiers", Advances in Solid State Circuits Technologies, 2010, pp. 81-94.

Momtaz A., et al., "A Fully Integrated SONET OC-48 Transceiver in Standard CMOS," IEEE Journal of Solid-State Circuits, Dec. 2001, vol. 36 (12), pp. 1964-1973.

Yang Z., et al., "A Fully Differential Charge Pump with Accurate Current Matching and Rail-to-Rail Common-Mode Feedback Circuit," IEEE International Symposium on Circuits and Systems, 2008, pp. 448-451.

Zhichao G., et al., "Design and Noise Analysis of a Fully-Differential Charge Pump for Phase-Locked Loops," Journal of Semiconductors, Oct. 2009, vol. 30 (10), pp. 105013-1 to 105013-6.

\* cited by examiner

FULLY DIFFERENTIAL CHARGE PUMP WITH SWITCHED-CAPACITOR COMMON-MODE FEEDBACK

TECHNICAL FIELD

Certain aspects of the present disclosure generally relate to electronic circuits and, more particularly, to fully differential charge pumps with switched-capacitor common-mode feedback (CMFB).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to fully differential charge pumps implemented with a switched-capacitor common-mode feedback (SC-CMFB) circuit.

Certain aspects of the present disclosure provide a phase-locked loop (PLL). The PLL generally includes a first phase-frequency detector (PFD), a charge pump, and a second PFD. The charge pump generally includes a plurality of charge pump branches configured to generate differential signals at differential output nodes, wherein the first PFD is configured to control a set of switches for controlling charging and discharging currents of the charge pump branches; and a switched-capacitor common-mode feedback (SC-CMFB) circuit coupled to the differential output nodes of the charge pump. The SC-CMFB circuit is configured to receive a reference common-mode voltage (Vcm) and to generate a common-mode feedback signal configured to bias the charge pump branches such that an actual Vcm of the differential signals equals the reference Vcm. At least one control input to the SC-CMFB circuit is based on a signal generated by the second PFD.

According to certain aspects, the second PFD is a replica of the first PFD.

According to certain aspects, the PLL further includes a frequency divider coupled to the second PFD. In certain aspects, the frequency divider is a divide-by-two (Div2) frequency divider. In certain aspects, the PLL also includes a non-overlapping clock generator coupled to the frequency divider, wherein the at least one control input to the SC-CMFB circuit is derived from the non-overlapping clock generator.

According to certain aspects, the SC-CMFB circuit includes a first set of capacitors coupled between the differential output nodes. The SC-CMFB circuit may be further configured to charge the first set of capacitors such that a voltage at a node between capacitors in the first set is configured to approach the actual Vcm of the differential signals during a first interval; and to adjust a charge across the first set of capacitors based on the reference Vcm voltage during a second interval, different from the first interval. In certain aspects, the common-mode feedback signal comprises the voltage at the node between the capacitors in the first set. In certain aspects, the SC-CMFB circuit further includes a second set of capacitors and is configured to adjust the charge across the first set of capacitors during the second interval based on a charge established across the second set of capacitors during the first interval. In certain aspects, the charge pump further includes a plurality of replica branches, where each of the replica branches is configured to replicate one of the charge pump branches. In certain aspects, the SC-CMFB circuit is further configured to charge the second set of capacitors during the first interval to a voltage equal to a difference between the reference Vcm and a bias voltage configured to bias the replica branches. In certain aspects, the SC-CMFB circuit further includes a first plurality of switches and is configured to charge the second set of capacitors by closing the first plurality of switches during the first interval. In certain aspects, the SC-CMFB circuit further includes a second plurality of switches coupled to the first and second sets of capacitors and is configured to adjust the charge across the first set of capacitors by closing the second plurality of switches during the second interval. In certain aspects, the at least one control input to the SC-CMFB circuit includes a first control input and a second control input. The first plurality of switches may be controlled by the first control input, and the second plurality of switches may be controlled by the second control input. In certain aspects, the bias voltage configured to bias the replica branches is connected with a node between capacitors in the second set. In certain aspects, the PLL further includes an oscillator configured to output a periodic signal. In this case, the first and second intervals may be determined based on the signal generated by the second PFD, and the signal may be generated by the second PFD based on the periodic signal and a reference signal.

According to certain aspects, the set of switches include up and down switches of the charge pump. In certain aspects, the first PFD is configured to generate up and down signals for controlling the up and down switches, respectively.

Certain aspects of the present disclosure provide a differential charge pump circuit. The differential charge pump circuit generally includes a charging circuit comprising a plurality of charge pump branches and configured to generate differential signals at differential output nodes; and an SC-CMFB circuit coupled to the differential output nodes of the charging circuit. The SC-CMFB circuit is configured to receive a reference Vcm and to generate a common-mode feedback signal configured to bias the charge pump branches such that an actual Vcm of the differential signals equals the reference Vcm, wherein at least one control input to the SC-CMFB circuit is based on a signal generated by a first PFD.

According to certain aspects, each of the charge pump branches includes a first switch configured to control a charge current of the charging circuit and a second switch configured to control a discharge current of the charging circuit. The first and second switches may be controlled via outputs of a second PFD, and the first PFD may be a replica of the second PFD.

According to certain aspects, the SC-CMFB circuit includes a first set of capacitors coupled between the differential output nodes. In certain aspects, the SC-CMFB circuit is further configured to charge the first set of capacitors such that a voltage at a node between capacitors in the first set is configured to approach the actual Vcm of the differential signals during a first interval; and to adjust a charge across the first set of capacitors based on the reference Vcm voltage during a second interval, different from the first interval. In certain aspects, the common-mode feedback signal comprises the voltage at the node between the capacitors in the first set. In certain aspects, the SC-CMFB circuit further comprises a second set of capacitors and is configured to adjust the charge across the first set of capacitors during the second interval based on a charge established across the second set of capacitors during the first interval. In certain aspects, the charging circuit further includes a plurality of replica branches, where each of the replica branches is configured to replicate one of the charge pump branches. The SC-CMFB circuit may be configured to charge the second set of capacitors during the first interval to a voltage equal to a difference between the reference Vcm and a bias voltage configured to bias the replica branches. In certain aspects, the SC-CMFB circuit further includes a first plurality of switches and is configured to charge the second set of capacitors by closing the first plurality of switches during the first interval. In certain aspects, the SC-CMFB circuit further includes a second plurality of switches coupled to the first and second sets of capacitors and is configured to adjust the charge across the first set of capacitors by closing the second plurality of switches during the second interval. In certain aspects, the at least one control input to the SC-CMFB circuit includes a first control input and a second control input. In this case, the first plurality of switches may be controlled by the first control input, and the second plurality of switches may be controlled by the second control input. In certain aspects, the bias voltage configured to bias the replica branches is connected with a node between capacitors in the second set. In certain aspects, the first and second intervals are determined based on the signal generated by the first PFD.

According to certain aspects, the charging circuit further includes a startup circuit configured to increase a slew rate of a charge current during transitions between charging and discharging cycles. In certain aspects, the charging circuit further includes an amplifier; each of the charge pump branches includes a first transistor configured to limit the charge current based on an output of the amplifier; and the startup circuit is further configured to decrease a voltage at the output of the amplifier via a sink current. In certain aspects, the startup circuit includes a second transistor, and a gate of the second transistor is coupled to a gate of the first transistor and to the output of the amplifier. In certain aspects, the startup circuit further includes a variable current source configured to sink the sink current, and the sink current sunk by the variable current source is adjusted based on a voltage at a drain of the second transistor. In certain aspects, the startup circuit further includes a third transistor connected in cascode with the second transistor, a node between the second and third transistors comprises a control input to the variable current source, and a gate of the third transistor is driven by a bias voltage of the charging circuit.

Certain aspects of the present disclosure provide a method for operating a charge pump circuit. The method generally includes generating differential signals at differential output nodes of the charge pump circuit via a plurality of charge pump branches; receiving a reference Vcm at an SC-CMFB circuit; generating a common-mode feedback signal using the SC-CMFB circuit, wherein the common-mode feedback signal is configured to bias the charge pump branches such that an actual Vcm of the differential signals equals the reference Vcm; and controlling the SC-CMFB circuit based on a signal generated by a first PFD.

Certain aspects of the present disclosure provide an apparatus. The apparatus generally includes means for generating differential signals at differential output nodes of the apparatus via a plurality of charge pump branches; means for generating a common-mode feedback signal, wherein the common-mode feedback signal is configured to bias the charge pump branches such that an actual Vcm of the differential signals equals a reference Vcm; and means for controlling the means for generating the common-mode feedback signal, based on a signal generated by means for detecting a phase offset between a periodic signal and a reference signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
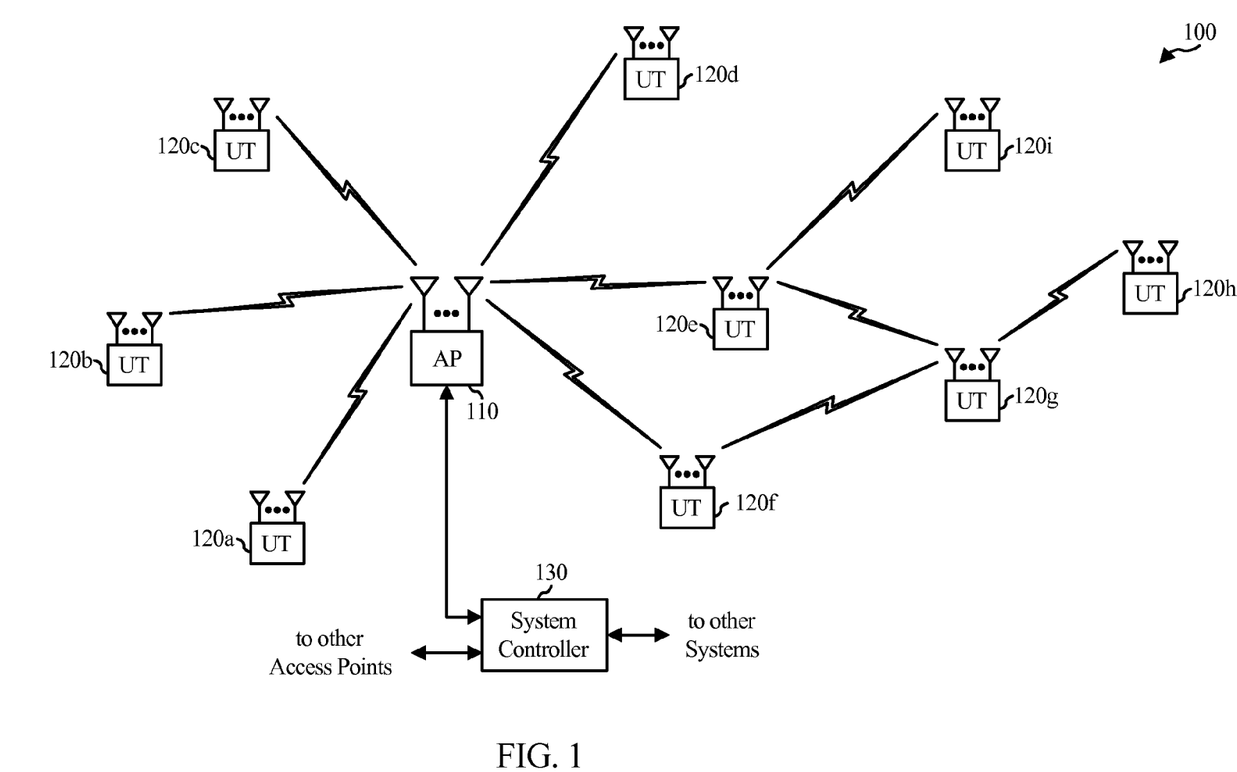
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$) The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more frequency synthesizers to generate periodic signals used for signal transmission and/or reception. Each frequency synthesizer may include a phase-locked loop (PLL) that includes a fully differential charge pump with a switched-capacitor common-mode feedback (SC-CMFB) circuit, as described below.

Figure 2:
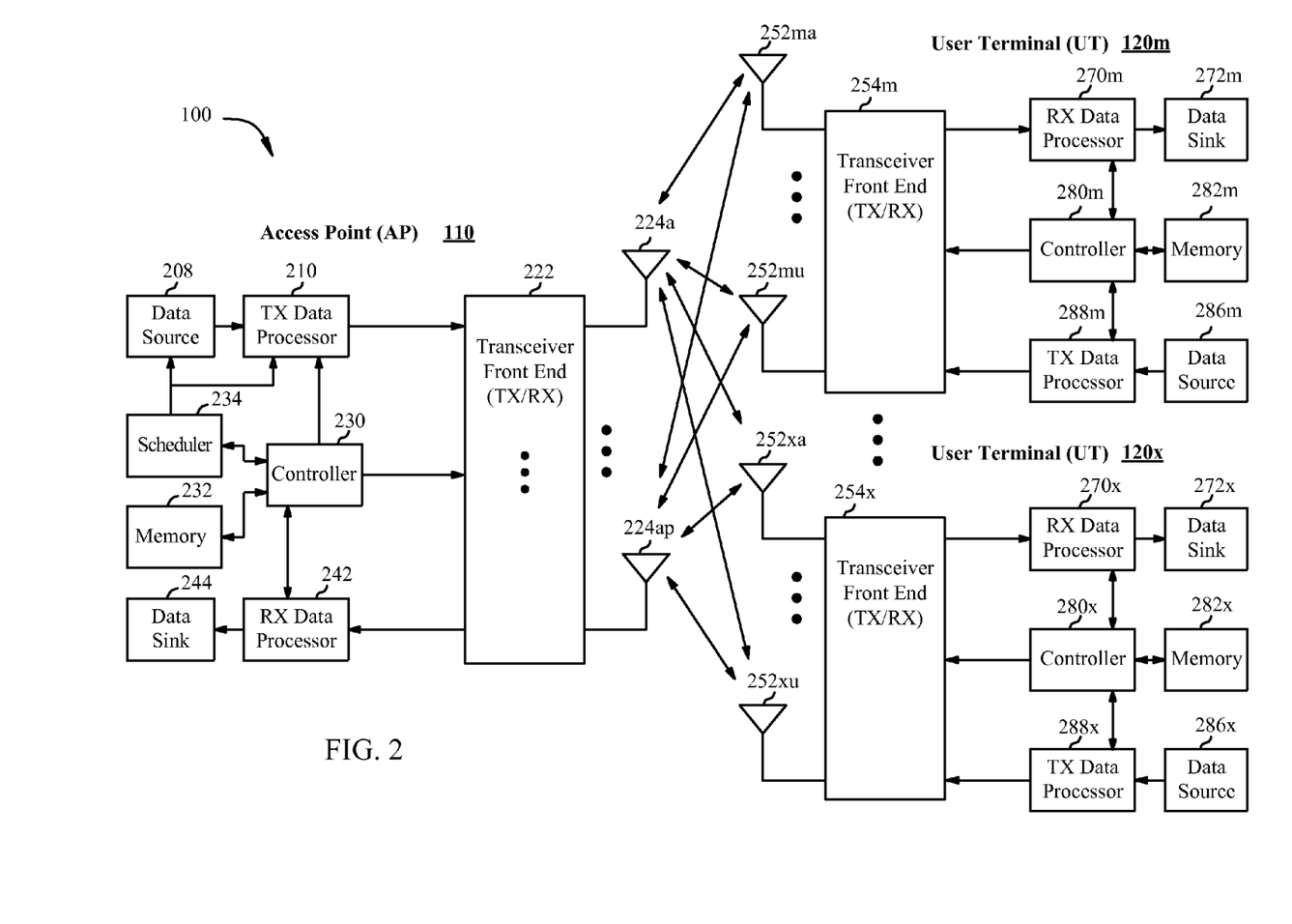
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut}$), antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more frequency synthesizers to generate periodic signals used for signal transmission and/or reception. Each frequency synthesizer may include a phase-locked loop (PLL) that includes a fully differential charge pump with a switched-capacitor common-mode feedback (SC-CMFB) circuit, as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
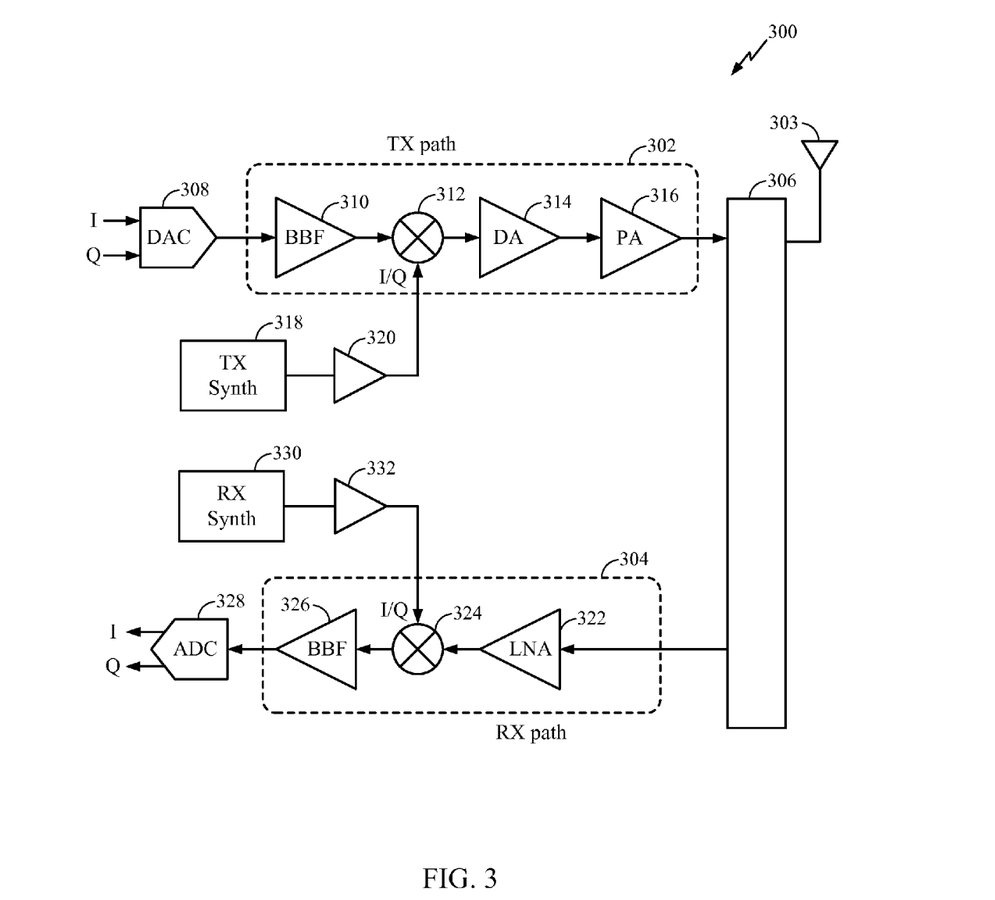
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

In some aspects of the present disclosure, the VCO of the frequency synthesizer may be implemented as a part of a phase-locked loop (PLL) circuit. The TX frequency synthesizer 318 and/or RX frequency synthesizer 330 may include a PLL that includes a fully differential charge pump with a switched-capacitor common-mode feedback (SC-CMFB) circuit, as described below.

Example Phase-Locked Loop

Figure 4:
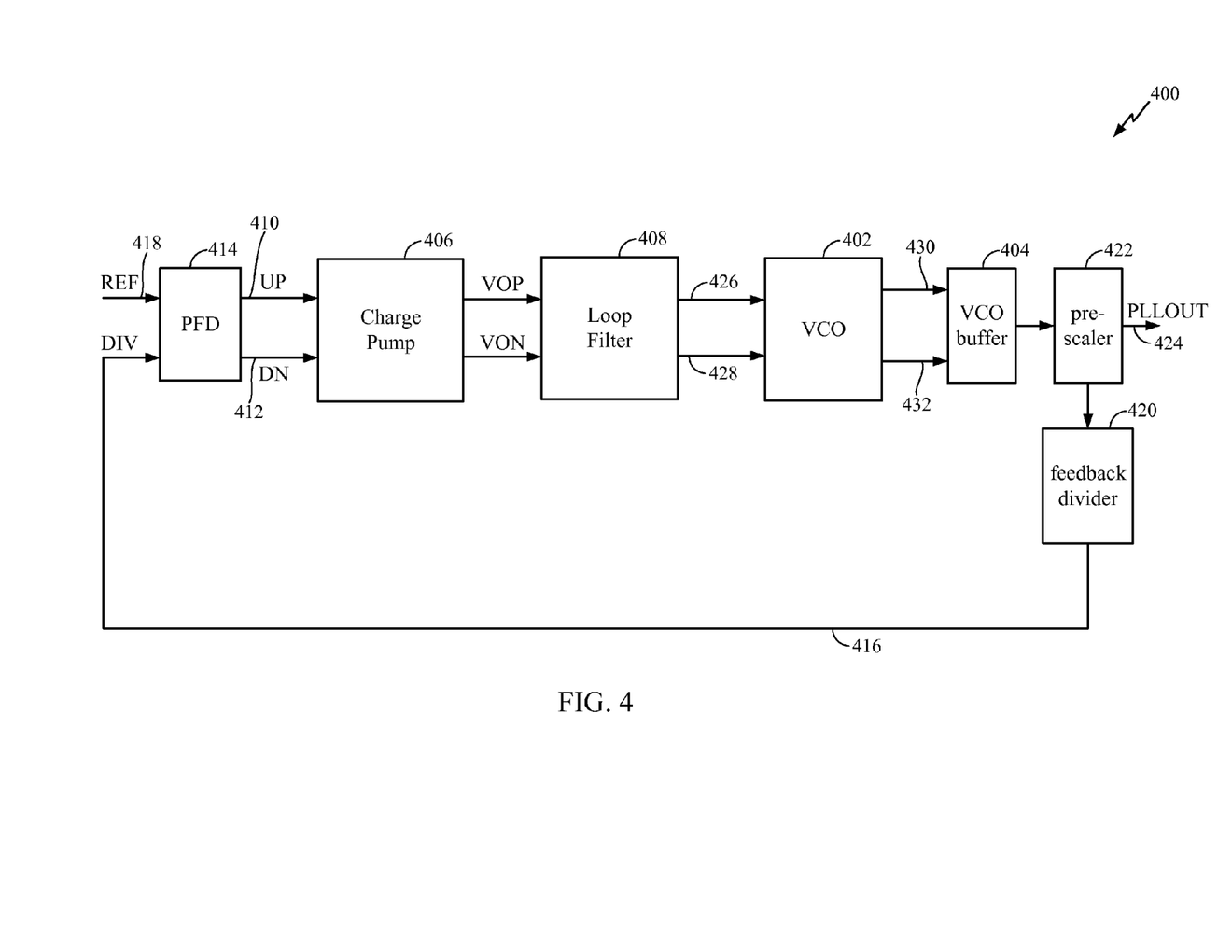
FIG. 4 is a block diagram of an example phase-locked loop (PLL) with a differential charge pump, in accordance with certain aspects of the present disclosure.

FIG. 4 is a block diagram of an example phase-locked loop (PLL) 400 comprising a VCO 402 interfaced with a VCO buffer 404, in accordance with certain aspects of the present disclosure. The PLL 400 may be utilized in a frequency synthesizer, such as the TX frequency synthesizer 318 or the RX frequency synthesizer 330 of FIG. 3.

As illustrated in FIG. 4, a charge pump 406 coupled to a low-pass loop filter 408 may provide a control voltage to the VCO 402 that determines an oscillation frequency of the VCO 402. The charge pump 406 and the VCO 402 may receive power via two power supply rails: a positive supply rail and a negative supply rail. Switches in the charge pump 406 may be controlled by up/down pulse signals 410, 412 (labeled "UP" and "DN"), and the loop filter 408 may reject the high frequency transient signals from this switching activity. These up/down pulse signals 410, 412 may be generated by a phase-frequency detector (PFD) 414, which may compare a feedback signal 416 (based on an output or processed output of the VCO 402 and labeled "DIV") to a reference frequency signal 418 (labeled "REF"). In an aspect, as illustrated in FIG. 4, the feedback signal 416 may be generated by buffering the output of the VCO 402 with the VCO buffer 404, scaling the buffered signal in a pre-scaler 422 to generate the PLL's output signal 424 (labeled "PLLOUT"), and dividing an output of the pre-scaler 422 in a feedback divider 420. In certain aspects of the present disclosure, the charge pump 406 may be a fully differential charge pump having a switched-capacitor common-mode feedback circuit, as described below.

In some aspects of the present disclosure, as illustrated in FIG. 4, the input control voltage for the VCO 402 may be provided by the charge pump 406 and the low-pass loop filter 408 via VCO control inputs 426, 428. A resonant tank circuit of the VCO 402 may generate, at differential VCO outputs 430, 432, a periodic signal having a specific frequency (e.g., determined by a voltage at the VCO control inputs 426, 428), which may be input to the VCO buffer 404. The VCO buffer 404 may be coupled to the differential VCO outputs 430, 432 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 430, 432.

Example Charge Pump with Switched-Capacitor Common-Mode Feedback

As presented above, the PLL 400 includes a PFD 414, which provides an up pulse signal 410 (labeled "UP") and a down pulse signal 412 (labeled "DN") to the charge pump 406. The up/down pulse signals 410, 412 may based on a phase offset between the feedback signal 416 and the reference frequency signal 418. For example, if there is a phase difference between the feedback signal 416 and the reference frequency signal 418, the PFD 414 generates the UP and DN signals, which are provided to the charge pump 406 to adjust the VCO control inputs 426, 428.

For example, if the UP signal output by the PFD 414 is logic high, then the charge pump 406 may pump charge onto a capacitor of the loop filter 408, which increases the amplitude of the differential VCO control inputs 426, 428. If the DN signal from the PFD 414 is logic high, the charge pump 406 may remove charge from the capacitor of the loop filter 408, which in turn decreases the amplitude of the differential VCO control inputs 426, 428. The loop filter 408 may store the charge provided by the charge pump 406 and may provide DC signals to the VCO. For certain aspects, the charge pump 406 may include a switch, controlled by the UP signal from the PFD 414, which selectively controls a current from a current source flowing into a capacitor of the loop filter 408. This charge pump may include another switch controlled by the DN signal from the PFD 414, which selectively controls a discharge current flowing from the loop filter 408 capacitor to a reference potential (e.g., an electrical ground), via another current source.

A fully differential charge pump (FDCP) includes separate charge pump branches to generate a positive voltage output (VOP) and a negative voltage output (VON) of the differential signals output by the FDCP. Each charge pump branch includes UP and DN switches controlled by the PFD 414. That is, an FDCP may include a first set of UP and DN switches for the charge pump branch configured to generate the positive voltage output (VOP), and second set of UP and DN switches for the charge pump branch configured to generate the negative voltage output (VON).

In some cases, FDCPs may implement a current-steering differential charge pump architecture. The current-steering architecture steers the charge and discharge currents (e.g., as controlled by the UP and DN switches, respectively), from one path to another (e.g., as opposed to limiting current flow of a corresponding current source). The current steering architecture may be used to reduce common-mode noise and supply variations. For example, an amplifier may be inserted between a current bias node and a charge pump node of a current-steering charge pump in order to suppress current mismatches. This allows for the drain voltage of a bias transistor of the current-steering charge pump to track charge pump output voltage and cancel out the current mismatch between UP and DN current of the charge pump. The main drawback of a current-steering charge pump architecture is power consumption. That is, a charge pump with current steering consumes more power than a single-ended charge pump because the current of a current-steering charge pump may be constantly active while a single-ended charge pump current is active only when UP or DN switches are closed.

Moreover, a continuous-time amplifier-based common-mode feedback (CMFB) circuit may be used to detect the common-mode voltage of the differential charge pump outputs (VOP and VON). The CMFB circuit may be used to provide voltage or current feedback to the charge pump to adjust the common-mode voltage of the differential outputs to a desired level. However, the continuous-time CMFB circuit may contribute noise to the differential outputs of the charge pump, which may be due, in major part, to the CMFB amplifier.

Certain aspects of the present disclosure eliminate a source of noise and power consumption that may be present in continuous-time amplifier-based CMFB circuits by replacing the continuous-time CMFB circuit with a low-noise switched-capacitor CMFB (SC-CMFB) circuit. In certain aspects, the FDCP may further include startup circuitry to assist the charge pump to transition more quickly between a discharging state (e.g., discharging a capacitor of the loop filter 408) and a charging state (e.g., charging a capacitor of the loop filter 408).

Figure 5:
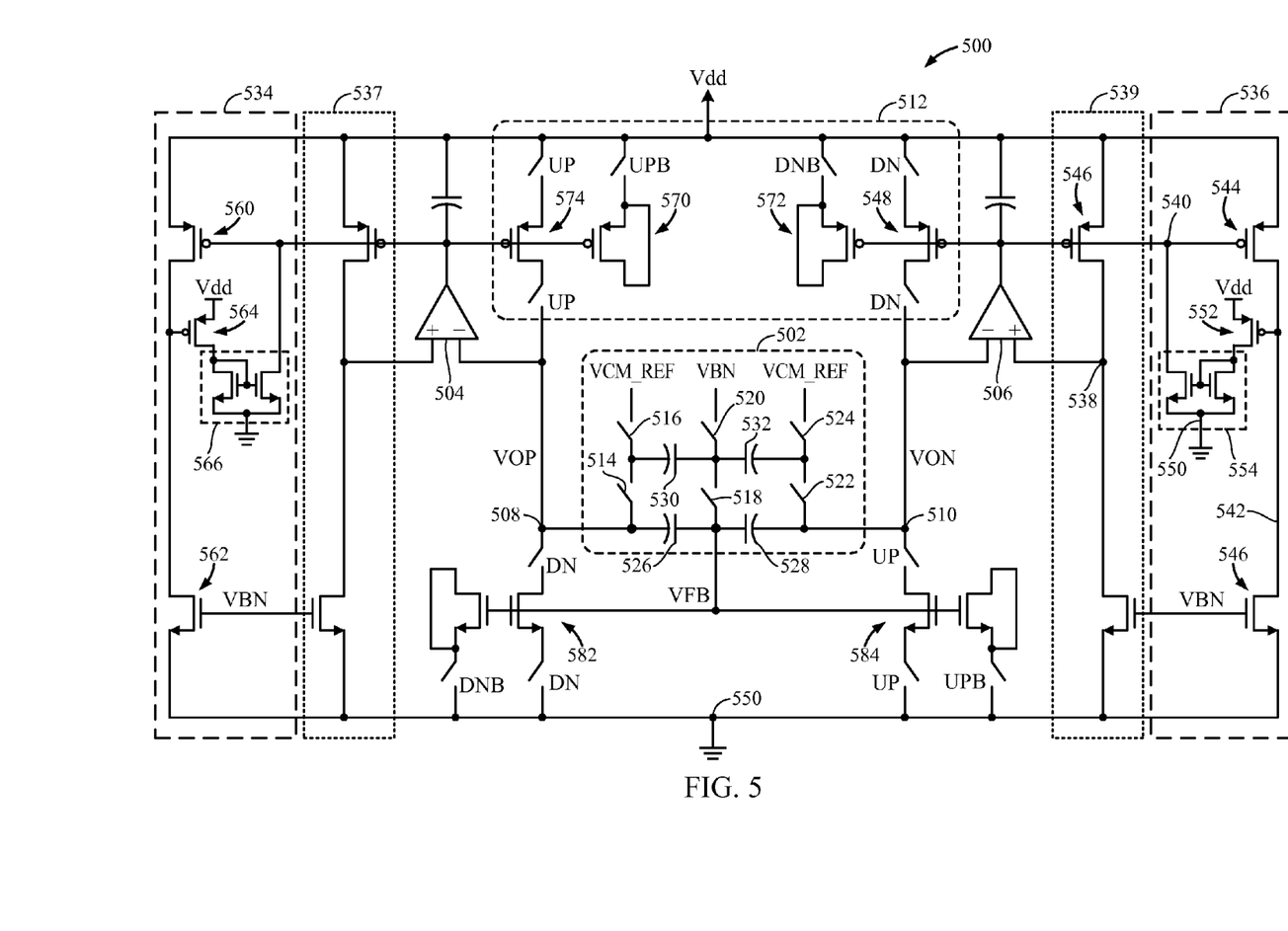
FIG. 5 is a schematic diagram of an example fully differential charge pump with a switched-capacitor common-mode feedback (SC-CMFB) circuit, in accordance with certain aspects of the present disclosure.

FIG. 5 illustrates an example fully differential charge pump (FDCP) 500 (for the charge pump 406 of FIG. 4) with an SC-CMFB circuit 502, in accordance with certain aspects of the present disclosure. The structure and operation of the SC-CMFB circuit 502 is described in conjunction with FIG. 6. The SC-CMFB circuit 502 includes a first set of capacitors 526, 528 that are coupled in series between the differential output nodes 508, 510. A voltage at a node between the first set of capacitors 526, 528 is used as a feedback voltage (VFB) for the charge pump to control current flow through transistors 582 and 584. By controlling VFB, the SC-CMFB circuit 502 can adjust the actual common-mode voltage of the differential output signals of the charge pump 500 to a desired common-mode voltage.

For example, the SC-CMFB circuit 502 includes a second set of capacitors 530, 532 connected in series, which are selectively connected in parallel with the first set of capacitors 526, 528 via switches 514, 518, 522 (collectively "Phi1 switches"). The second set of capacitors 530, 532 may be charged through switches 516, 520, 524 (collectively "Phi2 switches") when the Phi2 switches are closed. That is, during a first interval 614 ("Phi2," where Phi2 is logic high and Phi1 is logic low), the second set of capacitors 530, 532 may each be charged to a voltage equal to a difference between a reference common-mode voltage (VCM_REF) and a bias voltage (VBN) by closing the Phi2 switches. The input voltage VCM_REF may be selected based on a desired common-mode voltage for the charge pump differential output signals VOP and VON. For certain aspects, input voltage VBN serves as a bias voltage for replica branches 537, 539 of the charge pump 500 and may be generated by a bias circuit (not shown). During a second interval 615 ("Phi1," where Phi1 is logic high and Phi2 is logic low), the charge across the second set of capacitors 530, 532 is transferred to the first set of capacitors 526, 528.

Therefore, the voltage at the VFB node may be represented by the following equation:

$$VFB = VCM - VCM\_REF + VBN$$

where VCM is the actual common-mode voltage of the differential charge pump output signals VOP and VON, VCM_REF is the reference common-mode voltage, and VBN is the bias voltage for the replica branches 537, 539 of the charge pump 500. Thus, if VCM is greater than VCM_REF (the desired common-mode voltage), the SC-CMFB circuit 502 will generate a VFB greater than VBN, resulting in a subsequent decrease in VCM of the differential signals. However, if VCM is less than VCM_REF, the SC-CMFB circuit 502 will generate a VFB less than VBN, resulting in a subsequent increase in VCM of the differential signals. Therefore, the SC-CMFB circuit 502 is configured to implement a negative feedback control system and to control VFB such that the actual common-mode voltage of the charge pump's differential output signals equals VCM_REF and VFB equals VBN at steady state.

Figure 6:
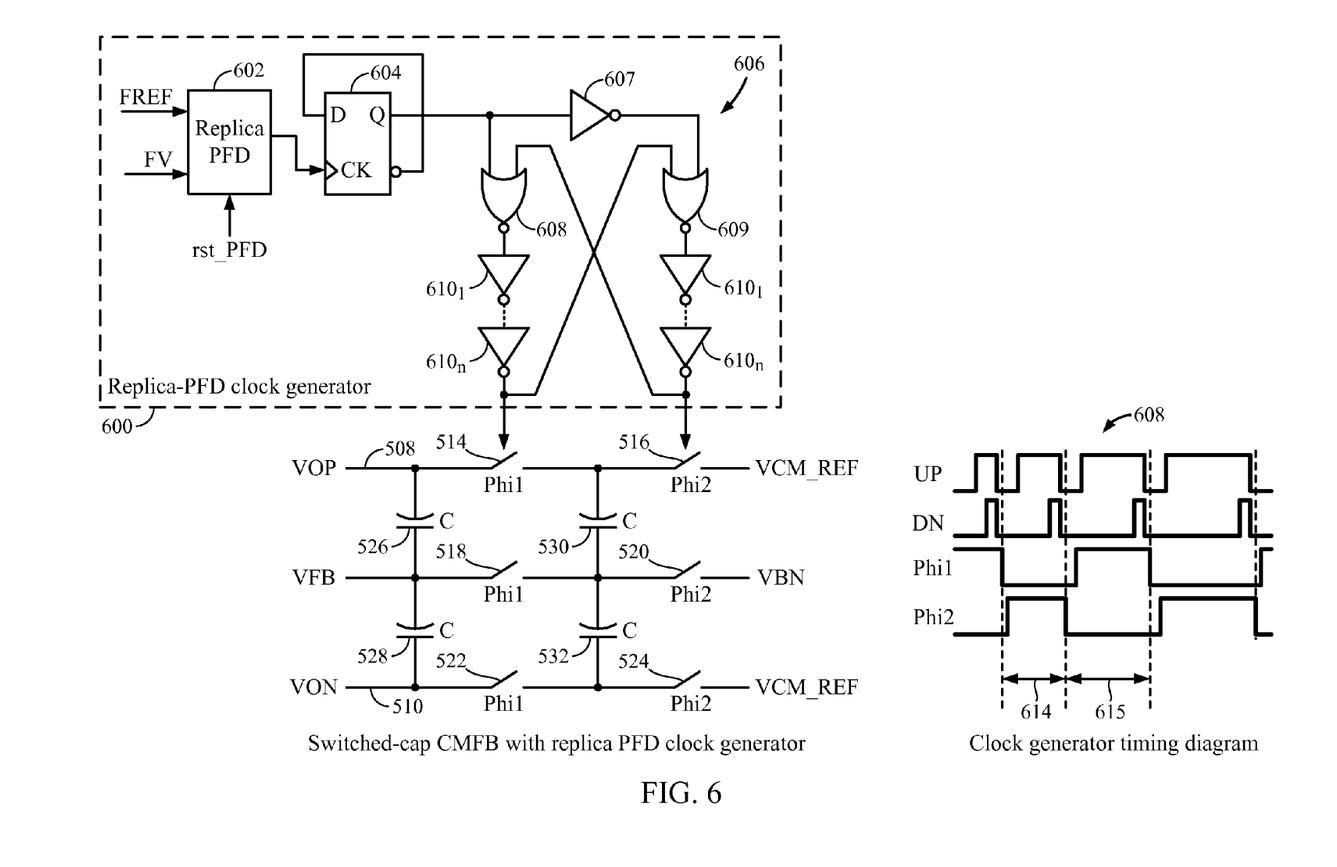
FIG. 6 illustrates the example SC-CMFB circuit of FIG. 5 and a replica-PFD clock generator configured to generate control signals for switches in the SC-CMFB circuit, in accordance with certain aspects of the present disclosure.

In certain aspects, as illustrated in the replica-PFD clock generator 600 of FIG. 6, Phi1 and Phi2 switches are controlled by signals derived from an output of a PFD 602. For certain aspects, the PFD 602 may be another PFD, different than the PFD 414 in the PLL 400. In this case, the PFD 602 may be a replica of the PFD 414. For other aspects, the PFD 602 is the PFD 414. The output of the PFD 602 may be used to control the Phi1 and Phi2 switches of the SC-CMFB circuit 502, as well as the UP and DN switches of the charge pump 500. For example, the output of the PFD 602 may be coupled with a frequency divider 604 to reduce the PFD output frequency. In certain aspects, the frequency divider 604 may be a divide-by-two (Div2) frequency divider, configured to divide the PFD output frequency by two. The Div2 divider may be implemented with a delay (D) flip-flop, as illustrated in FIG. 6. With a Div2 divider, the frequency of the Phi1 and Phi2 clock signals may be half that of the PLL's reference signal FREF (e.g., reference frequency signal 418) and feedback signal FV (e.g., feedback signal 416) in an effort to better track the UP and DN pulses, especially when FREF and FV are not frequency locked. For certain aspects, the frequency-divided (e.g., half-rate) Phi1 and Phi2 clock signals also extend the settling time of charge pump amplifiers (e.g., amplifiers 504, 506 of the charge pump 500 in FIG. 5) in an effort to ensure that the amplifiers are properly settled.

In certain aspects, the output of the frequency divider 604 is sent to a two-phase non-overlapping clock generator 606, which generates the Phi1 and Phi2 clock signals used to control the Phi1 and Phi2 switches, respectively. To avoid charge pump current glitches, the non-overlapping Phi1 and Phi2 clock signals may be configured to maintain a certain timing relationship with the UP and DN pulses. For example, the Phi1 and Phi2 clock signals may toggle when the UP and DN switches are opened (e.g., no active current flows in the charge pump 500 since the UP and DN pulses are both logic low), as illustrated in the timing diagram 608.

For certain aspects, as illustrated in FIG. 6, the non-overlapping clock generator 606 includes an inverter 607, a pair of NAND gates 609, and two cross-coupled sets of one or more inverters 610, 612. The non-overlapping clock generator 606 is designed to ensure that the Phi1 and Phi2 clock signals do not toggle (e.g., change from a logic high to a logic low, or vice versa) at the same time, such that the Phi1 and Phi2 switches operate as break-before-make. For example, as illustrated in the timing diagram 608, a delay exists between when the Phi1 clock signal toggles and when the Phi2 clock signal toggles. In certain aspects, the number (n) of inverters 610, 612 in the non-overlapping clock generator 606 may determine the delay between when the Phi1 clock signal toggles and when the Phi2 clock signal toggles. In certain aspects, the non-overlapping clock generator 606 ensures that at least 30 ps of delay exists between the toggle time of the non-overlapping Phi1 and Phi2 clock signals. Moreover, the non-overlapping clock generator 606 may also ensure that the Phi1 and Phi2 clock signals toggle at least 30 ps after the UP and DN signals turn off (e.g., transition to logic low).

In certain aspects, the fully differential charge pump 500 in FIG. 5 may include first and second startup circuits 534 and 536, each configured to decrease a time for the charge pump 500 to drive the differential output signals VOP and VON from a low to a high voltage (e.g., from a reference potential to Vdd). That is, the startup circuits 534, 536 allow the charge pump to more quickly switch between a discharging state and a charging state of VOP and VON.

For example, when the voltage VON is pulled down to a reference potential (e.g., when the UP switches are closed), the amplifier 506 will increase a voltage at the amplifier's output node 540 to a positive power supply voltage (e.g., Vdd) in an attempt to match the voltage at node 538 with the voltage VON. Thus, the voltage at the gate of PMOS transistor 548 will be driven to the power supply rail. Therefore, after the DN switches are closed, little to no current may flow from the source to the drain of PMOS transistor 548 (e.g., charging current of VON), and the charge pump 500 may not be able to quickly charge the loop filter capacitor (e.g., the capacitor of the loop filter 408 of the PLL 400 from FIG. 4) and drive the voltage VON at the differential output node 510 up from the reference potential.

To remedy this, the startup circuit 536 may be used to pull down the voltage at the output of the amplifier 506, reducing the on-resistance of the PMOS transistor 548. By reducing the on-resistance of the PMOS transistor 548, the current flow to the negative differential output node 510 may be increased, thus, reducing the time for VON to be pulled up from the reference potential (e.g., electrical ground 550).

For example, the startup circuit 536 may detect the voltage at output node 540 via a PMOS transistor 544. A drain of the PMOS transistor 544 may be coupled to a drain of an NMOS transistor 546, as illustrated. A voltage at node 542, between transistors 544 and 546, may be used to control a voltage-controlled current source 552 (e.g., PMOS transistor) for a current mirror 554. As illustrated, the current mirror 554 is configured to sink a current from node 540 (e.g., at the output of amplifier 506) to the reference potential, based on the current from the voltage-controlled current source.

Under nominal operating conditions for the charge pump 500, the on-resistance of the PMOS transistor 544 may be much smaller than the on-resistance of the NMOS transistor 546. Thus, a voltage at the node 542 may be nearly equal to the positive power supply voltage (e.g., Vdd), and the startup circuit 536 may have no impact on the charge pump 500 because no current would be sourced by the current source 552. However, when the voltage VON at the differential output node 510 is pulled to the reference potential (e.g., electrical ground 550) and the voltage at the amplifier's output node 540 is equal to the positive power supply voltage (e.g., Vdd), the PMOS transistor 544 may sense that no current flow exists through the negative charge pump branch to the differential output node 510. In other words, the output of the amplifier 506 drives the gate voltage of the PMOS transistor 544 to the positive voltage rail, and thus, the on-resistance of the PMOS transistor 544 may increase. As a result, the voltage at node 542 may drop.

By decreasing a voltage at the node 542, current may be sourced by the current source 552 into the current mirror 554. Thus, current may be pulled from node 540 to the reference potential (e.g., electrical ground 550) of the current mirror 554, resulting in a lower voltage at node 540 and gate of transistor 548. As a result, the on-resistance of the transistor 548 decreases, allowing current flow from the positive voltage rail to more quickly drive VON.

Similarly, the startup circuit 534 may be configured to pull up a voltage VOP at the differential output node 508. The startup circuit 534 also includes a PMOS transistor 560, NMOS transistor 562, a current source 564, and a current mirror 566, which operate in a similar manner as startup circuit 536. In certain aspects, the gates of the NMOS transistors 562 and 546 may be coupled to VBN, the bias voltage for the replica branches 537, 539.

Moreover, as presented above, the FDCP 500 may include a non-current steering architecture 512 which only consumes power when the UP or DN switches are closed. In comparison with a current-steering differential charge pump, the charge pump 500 achieves similar suppressions of common-mode noise, supply variation, and UP and DN switching noise due to the use of dummy branches 570, 572 with equivalent gate capacitance to that of the normal charge pump branches. For example, the dummy branch 570 ensures that an impedance at the output of the amplifier 504 remains almost constant when the UP switches are turned on and off. In other words, when the UP switches are closed, the gate-to-source capacitance ($C_{gs}$) of the PMOS transistor 574 is charged, and when the UP switches are opened (e.g., UPB switches are closed), a $C_{gs}$ of the dummy branch 570 (e.g., equivalent to the $C_{gs}$ of the PMOS transistor 574) is charged.

Figure 7:
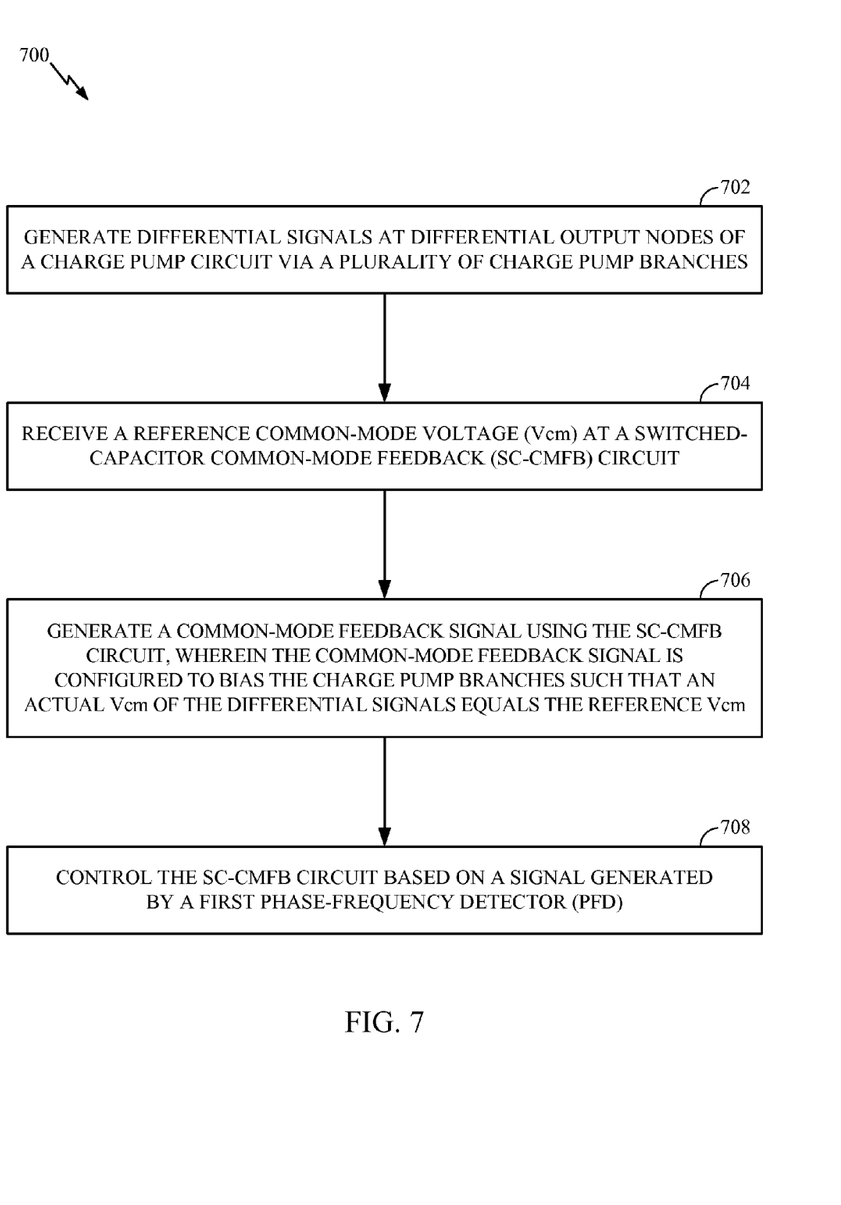
FIG. 7 is a flow diagram of example operations for using a charge pump circuit with an SC-CMFB circuit, in accordance with certain aspects of the present disclosure.

FIG. 7 is a flow diagram of example operations 700 for using a charge pump circuit (e.g., the charge pump 500), in accordance with certain aspects of the present disclosure. The operations 700 may begin, at block 702, with the charge pump circuit generating differential signals (e.g., VOP and VON) at differential output nodes (e.g., nodes 508, 510) of the charge pump circuit via a plurality of charge pump branches (e.g., charge pump branches with UP and DN switches in FIG. 5). At block 704, a switched-capacitor common-mode feedback (SC-CMFB) circuit (e.g., SC-CMFB circuit 502) may receive a reference common-mode voltage (Vcm) (e.g., VCM_REF). At block 706, the SC-CMFB circuit may generate a common-mode feedback signal (e.g., VFB). The common-mode feedback signal is configured to bias the charge pump branches such that an actual Vcm of the differential signals equals the reference Vcm. At block 708, the SC-CMFB circuit may be controlled based on a signal generated by a first phase-frequency detector (PFD) (e.g., PFD 602).

According to certain aspects, generating the differential signals at block 702 involves controlling a charge current via a first switch in each of the charge pump branches; controlling a discharge current via a second switch in each of the charge pump branches; and controlling the first and second switches via outputs of a second PFD (e.g., PFD 414). For certain aspects, the first PFD is a replica of the second PFD.

According to certain aspects, the operations 700 further involve charging a first set of capacitors (e.g., capacitors 526, 528) in the SC-CMFB circuit such that a voltage at a node between capacitors in the first set is configured to approach the actual Vcm of the differential signals during a first interval (e.g., interval 614). The first set of capacitors may be coupled between the differential output nodes of the charge pump circuit. For certain aspects, the operations 700 further include adjusting a charge across the first set of capacitors based on the reference Vcm voltage during a second interval (e.g., interval 615), different from the first interval. The common-mode feedback signal is the voltage at the node between the capacitors in the first set for certain aspects. For certain aspects, the adjusting entails adjusting the charge across the first set of capacitors during the second interval based on a charge established across a second set of capacitors (e.g., capacitors 530, 532) in the SC-CMFB circuit during the first interval. For certain aspects, the operations 700 further involve charging the second set of capacitors during the first interval to a voltage equal to a difference between the reference Vcm and a bias voltage (e.g., VBN) configured to bias a plurality of replica branches (e.g., replica branches 537, 539) in the charge pump circuit, wherein each of the replica branches is configured to replicate one of the charge pump branches. Charging the second set of capacitors involves closing a first plurality of switches (e.g., switches 516, 520, 524) in the SC-CMFB circuit during the first interval for certain aspects. For certain aspects, the adjusting includes adjusting the charge across the first set of capacitors by closing a second plurality of switches (e.g., switches 514, 518, 522) in the SC-CMFB circuit during the second interval, where the second plurality of switches are coupled to the first and second sets of capacitors. For certain aspects, controlling the SC-CMFB circuit entails controlling the first plurality of switches using a first control input (e.g., Phi2 clock signal) based on the signal generated by the first PFD and controlling the second plurality of switches using a second control input (e.g., Phi1 clock signal) based on the signal generated by the first PFD.

According to certain aspects, the bias voltage configured to bias the replica branches is connected with a node between capacitors in the second set.

According to certain aspects, controlling the SC-CMFB circuit involves determining the first and second intervals based on the signal generated by the first PFD.

According to certain aspects, the operations 700 further includes increasing, via a startup circuit (e.g., startup circuit 534 or 536), a slew rate of a charge current of at least one of the charge pump branches during transitions between charging and discharging cycles. For certain aspects, the charge pump circuit further comprises an amplifier (e.g., amplifier 504 or 506). In this case, the at least one of the charge pump branches may include a transistor (e.g., transistor 524 or 548) configured to limit the charge current based on an output of the amplifier. For certain aspects, the increasing involves sinking, via a variable current source (e.g., voltage-controlled current source 552 or 564) in the startup circuit, a sink current to decrease a voltage at the output of the amplifier.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing or means for determining may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for generating differential signals may comprise a charging circuit (e.g., the charge pump branches of the charge pump 500 depicted in FIG. 5). Means for generating a common-mode feedback signal may comprise a CMFB circuit (e.g., the SC-CMFB circuit 502 illustrated in FIG. 5). Means for controlling the means for generating the common-mode feedback signal may comprise a clock generation circuit (e.g., the replica-PFD clock generator 600 shown in FIG. 6).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A differential charge pump circuit, comprising:
a charging circuit comprising a plurality of charge pump branches and configured to generate differential signals at differential output nodes; and
a switched-capacitor common-mode feedback (SC-CMFB) circuit coupled to the differential output nodes of the charging circuit, wherein the SC-CMFB circuit is configured to:
receive a reference common-mode voltage (Vcm); and
generate a common-mode feedback signal configured to bias the charge pump branches such that an actual Vcm of the differential signals equals the reference Vcm, wherein at least one control input to the SC-CMFB circuit is based on a signal generated by a first phase-frequency detector (PFD).

2. The differential charge pump circuit of claim 1, wherein:
each of the charge pump branches comprises a first switch configured to control a charge current of the charging circuit and a second switch configured to control a discharge current of the charging circuit;
the first and second switches are controlled via outputs of a second PFD; and
the first PFD is a replica of the second PFD.

3. The differential charge pump circuit of claim 1, wherein the SC-CMFB circuit comprises a first set of capacitors coupled between the differential output nodes and wherein the SC-CMFB circuit is further configured to:
charge the first set of capacitors such that a voltage at a node between capacitors in the first set is configured to approach the actual Vcm of the differential signals during a first interval; and
adjust a charge across the first set of capacitors based on the reference Vcm voltage during a second interval, different from the first interval.

4. The differential charge pump circuit of claim 3, wherein the common-mode feedback signal comprises the voltage at the node between the capacitors in the first set.

5. The differential charge pump circuit of claim 3, wherein the SC-CMFB circuit further comprises a second set of capacitors and wherein the SC-CMFB circuit is configured to adjust the charge across the first set of capacitors during the second interval based on a charge established across the second set of capacitors during the first interval.

6. The differential charge pump circuit of claim 5, wherein:
the charging circuit further comprises a plurality of replica branches;
each of the replica branches is configured to replicate one of the charge pump branches; and
the SC-CMFB circuit is configured to charge the second set of capacitors during the first interval to a voltage equal to a difference between the reference Vcm and a bias voltage configured to bias the replica branches.

7. The differential charge pump circuit of claim 6, wherein the SC-CMFB circuit further comprises a first plurality of switches and wherein the SC-CMFB circuit is configured to charge the second set of capacitors by closing the first plurality of switches during the first interval.

8. The differential charge pump circuit of claim 7, wherein the SC-CMFB circuit further comprises a second plurality of switches coupled to the first and second sets of capacitors and wherein the SC-CMFB circuit is configured to adjust the charge across the first set of capacitors by closing the second plurality of switches during the second interval.

9. The differential charge pump circuit of claim 8, wherein the at least one control input to the SC-CMFB circuit comprises a first control input and a second control input, wherein the first plurality of switches are controlled by the first control input, and wherein the second plurality of switches are controlled by the second control input.

10. The differential charge pump circuit of claim 6, wherein the bias voltage configured to bias the replica branches is connected with a node between capacitors in the second set.

11. The differential charge pump circuit of claim 3, wherein the first and second intervals are determined based on the signal generated by the first PFD.

12. The differential charge pump circuit of claim 1, wherein the charging circuit further comprises a startup circuit configured to increase a slew rate of a charge current during transitions between charging and discharging cycles.

13. The differential charge pump circuit of claim 12, wherein:
the charging circuit further comprises an amplifier;
each of the charge pump branches comprises a first transistor configured to limit the charge current based on an output of the amplifier; and
the startup circuit is further configured to decrease a voltage at the output of the amplifier via a sink current.

14. The differential charge pump circuit of claim 13, wherein the startup circuit comprises a second transistor and wherein a gate of the second transistor is coupled to a gate of the first transistor and to the output of the amplifier.

15. The differential charge pump circuit of claim 14, wherein the startup circuit further comprises a variable current source configured to sink the sink current and wherein the sink current sunk by the variable current source is adjusted based on a voltage at a drain of the second transistor.

16. The differential charge pump circuit of claim 15, wherein the startup circuit further comprises a third transistor connected in cascode with the second transistor, wherein a node between the second and third transistors comprises a control input to the variable current source, and wherein a gate of the third transistor is driven by a bias voltage of the charging circuit.

17. A method for operating a charge pump circuit, comprising:
  generating differential signals at differential output nodes of the charge pump circuit via a plurality of charge pump branches;
  receiving a reference common-mode voltage (Vcm) at a switched-capacitor common-mode feedback (SC-CMFB) circuit;
  generating a common-mode feedback signal using the SC-CMFB circuit, wherein the common-mode feedback signal is configured to bias the charge pump branches such that an actual Vcm of the differential signals equals the reference Vcm; and
  controlling the SC-CMFB circuit based on a signal generated by a first phase-frequency detector (PFD).

18. The method of claim 17, wherein generating the differential signals comprises:
  controlling a charge current via a first switch in each of the charge pump branches;
  controlling a discharge current via a second switch in each of the charge pump branches; and
  controlling the first and second switches via outputs of a second PFD, wherein the first PFD is a replica of the second PFD.

19. The method of claim 17, further comprising:
  charging a first set of capacitors in the SC-CMFB circuit such that a voltage at a node between capacitors in the first set is configured to approach the actual Vcm of the differential signals during a first interval, wherein the first set of capacitors is coupled between the differential output nodes of the charge pump circuit; and
  adjusting a charge across the first set of capacitors based on the reference Vcm voltage during a second interval, different from the first interval, wherein the common-mode feedback signal comprises the voltage at the node between the capacitors in the first set.

20. The method of claim 19, wherein the adjusting comprises adjusting the charge across the first set of capacitors during the second interval based on a charge established across a second set of capacitors in the SC-CMFB circuit during the first interval.

21. The method of claim 20, further comprising charging the second set of capacitors during the first interval to a voltage equal to a difference between the reference Vcm and a bias voltage configured to bias a plurality of replica branches in the charge pump circuit, wherein each of the replica branches is configured to replicate one of the charge pump branches.

22. The method of claim 21, wherein charging the second set of capacitors comprises closing a first plurality of switches in the SC-CMFB circuit during the first interval.

23. The method of claim 22, wherein:
  the adjusting comprises adjusting the charge across the first set of capacitors by closing a second plurality of switches in the SC-CMFB circuit during the second interval;
  the second plurality of switches are coupled to the first and second sets of capacitors; and
  controlling the SC-CMFB circuit comprises:
    controlling the first plurality of switches using a first control input based on the signal generated by the first PFD; and
    controlling the second plurality of switches using a second control input based on the signal generated by the first PFD.

24. The method of claim 21, wherein the bias voltage configured to bias the replica branches is connected with a node between capacitors in the second set.

25. The method of claim 19, wherein controlling the SC-CMFB circuit comprises determining the first and second intervals based on the signal generated by the first PFD.

26. The method of claim 17, further comprising increasing, via a startup circuit, a slew rate of a charge current of at least one of the charge pump branches during transitions between charging and discharging cycles, wherein:
  the charge pump circuit further comprises an amplifier;
  the at least one of the charge pump branches comprises a transistor configured to limit the charge current based on an output of the amplifier; and
  the increasing comprises sinking, via a variable current source in the startup circuit, a sink current to decrease a voltage at the output of the amplifier.

27. A phase-locked loop (PLL), comprising:
  a first phase-frequency detector (PFD);
  a charge pump comprising:
    a plurality of charge pump branches configured to generate differential signals at differential output nodes, wherein the first PFD is configured to control a set of switches for controlling charging and discharging currents of the charge pump branches; and
    a switched-capacitor common-mode feedback (SC-CMFB) circuit coupled to the differential output nodes of the charge pump, wherein the SC-CMFB circuit is configured to:
      receive a reference common-mode voltage (Vcm); and
      generate a common-mode feedback signal configured to bias the charge pump branches such that an actual Vcm of the differential signals equals the reference Vcm; and
  a second PFD, wherein at least one control input to the SC-CMFB circuit is based on a signal generated by the second PFD.

28. The PLL of claim 27, wherein the second PFD is a replica of the first PFD.

29. The PLL of claim 27, further comprising a frequency divider coupled to the second PFD.

30. The PLL of claim 29, further comprising a non-overlapping clock generator coupled to the frequency divider, wherein the at least one control input to the SC-CMFB circuit is derived from the non-overlapping clock generator.

* * * * *